(12) United States Patent
Kim et al.

(10) Patent No.: US 9,560,767 B2
(45) Date of Patent: Jan. 31, 2017

(54) WIRING BOARDS AND SEMICONDUCTOR MODULES INCLUDING THE SAME

(71) Applicant: SAMSUNG ELECTRONICS CO., LTD., Suwon-si, Gyeonggi-do (KR)

(72) Inventors: Yonghoon Kim, Suwon-si (KR); Seung Hwan Kim, Hwaseong-si (KR); Heeseok Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/734,322

(22) Filed: Jan. 4, 2013

(65) Prior Publication Data
US 2013/0221485 A1   Aug. 29, 2013

(30) Foreign Application Priority Data

Feb. 27, 2012   (KR) .................. 10-2012-0019760

(51) Int. Cl.
| | |
|---|---|
| *H05K 1/16* | (2006.01) |
| *H05K 1/18* | (2006.01) |
| *H01L 49/02* | (2006.01) |
| *H05K 3/46* | (2006.01) |

(52) U.S. Cl.
CPC ............. *H05K 1/185* (2013.01); *H01L 28/40* (2013.01); *H01L 2224/48091* (2013.01); *H01L 2224/48227* (2013.01); *H01L 2924/15311* (2013.01); *H01L 2924/19105* (2013.01); *H05K 3/4608* (2013.01); *H05K 2201/0979* (2013.01); *H05K 2201/10015* (2013.01)

(58) Field of Classification Search
CPC ............................. H01L 28/40; H01K 1/185

USPC .......................................... 257/532; 174/255
See application file for complete search history.

(56) References Cited

U.S. PATENT DOCUMENTS

| | | | | |
|---|---|---|---|---|
| 5,556,811 | A | * | 9/1996 | Agatstein .................. G06F 1/26 257/E23.068 |
| 7,348,213 | B2 | | 3/2008 | Komatsu |
| 7,350,296 | B2 | | 4/2008 | Ryu et al. |
| 7,690,109 | B2 | | 4/2010 | Mori et al. |
| 8,024,858 | B2 | * | 9/2011 | Tanaka .................... H01L 24/82 29/832 |
| 8,110,896 | B2 | * | 2/2012 | Hsu ............................... 257/532 |
| 8,829,357 | B2 | * | 9/2014 | Mikado et al. .............. 174/260 |

(Continued)

FOREIGN PATENT DOCUMENTS

| | | |
|---|---|---|
| JP | 2010-074151 | 4/2010 |
| JP | 2011-060875 | 3/2011 |
| KR | 1020090050140 | 5/2009 |

*Primary Examiner* — Tran Tran

(74) *Attorney, Agent, or Firm* — F. Chau & Associates, LLC

(57) ABSTRACT

A wiring board includes a metal core including a first surface and a second surface facing each other and a first portion and a second portion disposed on the first and second surfaces, respectively. The first and second portions each include a plurality of insulating layers and a plurality of wiring layers stacked in an alternating manner. At least one capacitor is disposed in at least one interior region. The at least one capacitor includes first and second electrodes. The at least one interior region exposes a portion of the metal core and a portion of at least one of the first and second portions adjacent to the metal core and at least one first via electrically connects one of the wiring layers of the first portion with the first and second electrodes.

20 Claims, 11 Drawing Sheets

(56) References Cited

U.S. PATENT DOCUMENTS

2007/0143993 A1* 6/2007 Hsu .................. H05K 1/0231
           29/832
2010/0282498 A1   11/2010 Tezak et al.
2013/0161833 A1*  6/2013 Pendse .................. 257/777

* cited by examiner

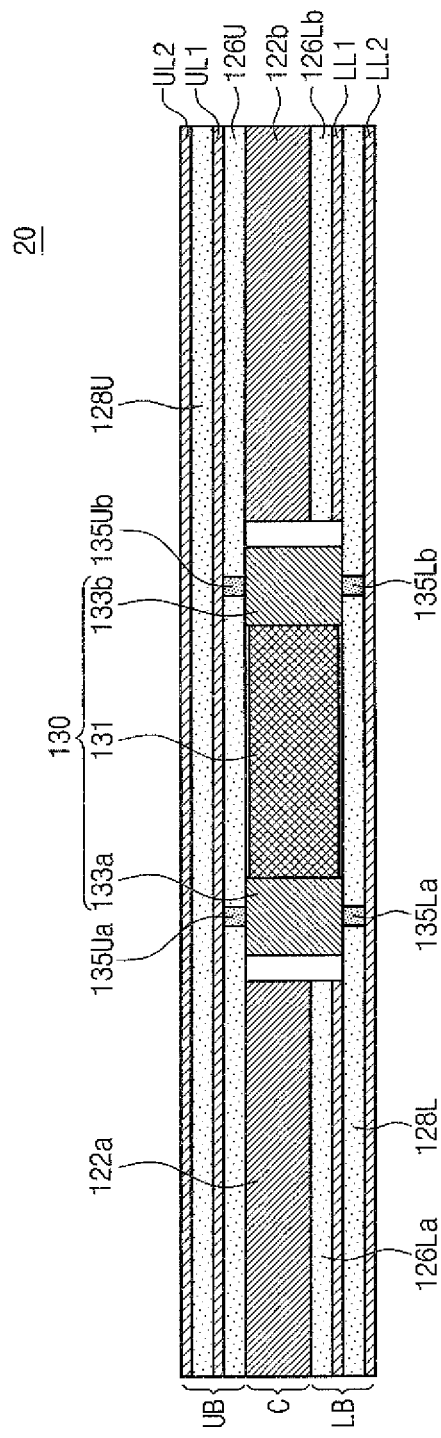

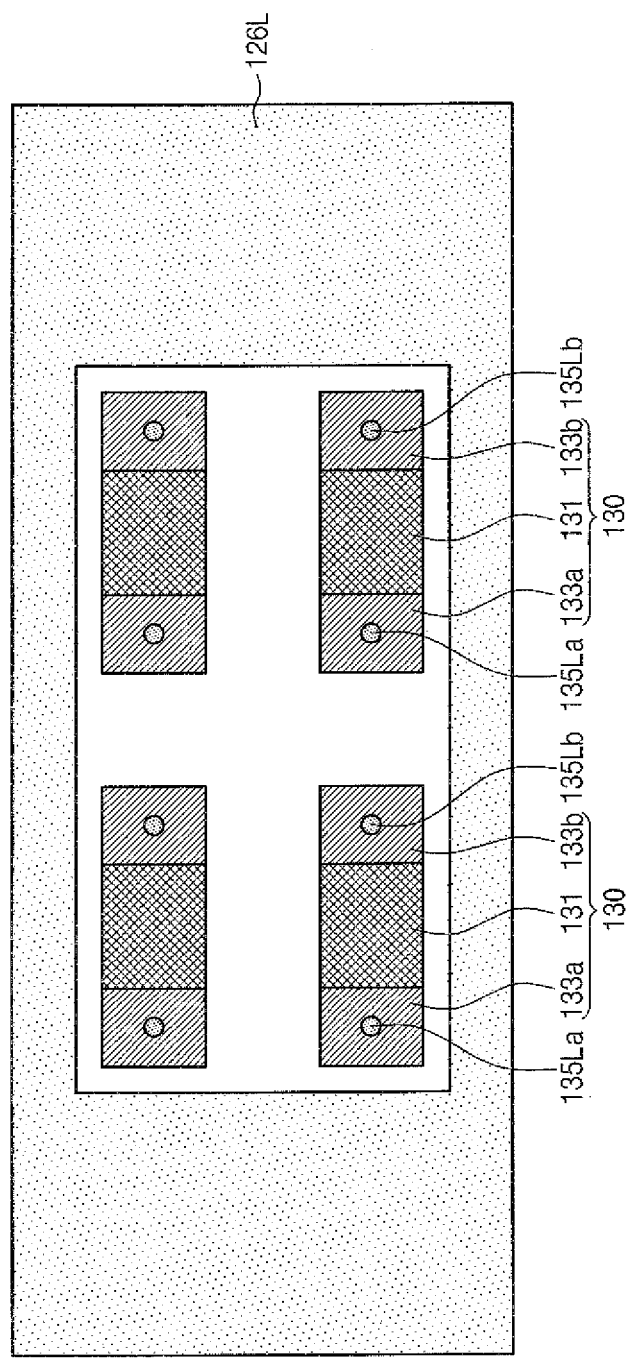

WIRING BOARDS AND SEMICONDUCTOR MODULES INCLUDING THE SAME

CROSS-REFERENCE TO RELATED APPLICATIONS

This application claims priority to Korean Patent Application No. 10-2012-0019760, filed on Feb. 27, 2012, the disclosure of which is hereby incorporated by reference herein in its entirety.

(i) Technical Field

Example embodiments of the inventive concept relate to wiring boards and semiconductor modules including the same, and more particularly, to wiring boards embedded with a capacitor and semiconductor modules including the same.

(ii) Discussion of the Related Art

A semiconductor module may include a semiconductor package and a wiring board. Each of the wiring board and the semiconductor package may include a capacitor. For example, the capacitor in the wiring board may be provided in the form of an embedding structure. The capacitor in the wiring board may include, for example, electrodes, to which predetermined voltages are applied through a via pattern.

As the semiconductor module becomes miniaturized, the wiring board becomes thinner and thinner, and thus, the capacitor in the wiring board may become too thin to secure a desired capacitance. Accordingly, it may be necessary to develop technology allowing the capacitor in the wiring board to have a desired capacitance.

SUMMARY

An example embodiment of the inventive concept provides a wiring board with a high capacitance.

An example embodiment of the inventive concept provides a semiconductor module, in which a wiring board with a high capacitance is provided.

According to an example embodiment of the inventive concept, a wiring board may include a metal core with a first and second surfaces facing each other, first and second portions disposed on the first and second surfaces, respectively, each of the first and second portions including a plurality of insulating layers and a plurality of wiring layers stacked in an alternating manner, at least one capacitor disposed in at least one interior region, the at least one capacitor including first and second electrodes thicker than the metal core, and the at least one interior region exposes a portion of the metal core and a portion of at least one of the first and second portions adjacent to the metal core, and at least one first via electrically connecting one of the wiring layers of the first portion with the first and second electrodes. A surface of the first and second electrodes is in contact with the at least one first via.

In example embodiments, at least one of the insulating layers of the first and second portions may include prepreg materials.

In an example embodiment, the wiring board may further include at least one second via electrically connecting one of the wiring layers of the second portion with the first and second electrodes.

In an example embodiment, the at least one first via may include a plurality of first vias connecting the one of the wiring layers of the first portion with the first and second electrodes, and the at least one second via may include a plurality of second vias connecting the one of the wiring layers of the second portion with the first and second electrodes.

In an example embodiment, the capacitor may further comprise a dielectric layer interposed between the first and second electrodes and including a ceramic material.

In an example embodiment, the at least one interior region may include a plurality of interior regions, and the at least one capacitor may be disposed in each of the interior regions.

In an example embodiment, the at least one capacitor may include a plurality of capacitors disposed in each of the interior regions. The capacitors may have a regular shape in the interior regions.

According to an example embodiment of the inventive concept, a semiconductor module may include a wiring board including a metal core with a first and second surfaces facing each other, first and second portions disposed on the first and second surfaces, respectively, at least one first capacitor disposed in at least one interior region, and at least one first via, a semiconductor chip mounted on the wiring board, and a connecting pattern connecting the semiconductor chip electrically with the wiring board. Each of the first and second portions may include a plurality of insulating layers and a plurality of wiring layers stacked in an alternating manner, the first capacitor may include first and second electrodes thicker than the metal core. The at least one interior region may expose a portion of the metal core and a portion of at least one of the first and second portions adjacent to the metal core, and the at least one first via connects one of the wiring layers of the first portion electrically with the first and second electrodes, and a surface of the first and second electrodes is in contact with the at least one first via.

In an example embodiment, the at least one interior region may include a plurality of interior regions, and the at least one first capacitor may be disposed in each of the interior regions.

In an example embodiment, the at least one capacitor may include a plurality of capacitors disposed in each of the interior regions to have a regular shape therein.

In an example embodiment, the semiconductor module may further include a voltage regulation module disposed on the wiring board, and a second capacitor disposed adjacent to the voltage regulation module on the wiring board.

In an example embodiment, the semiconductor module may further include a package substrate disposed between the wiring board and the semiconductor chip.

In an example embodiment, the semiconductor chip may be mounted on a surface of the package substrate, and the semiconductor module may further include a third capacitor disposed adjacent to the semiconductor chip on the surface of the package substrate.

In an example embodiment, the connecting pattern may be a solder bump.

According to an example embodiment of the inventive concept, a wiring board is provided. The wiring board includes a core portion including a first metal core and a second metal core spaced apart from each other, an upper portion including a plurality of first insulating layers and a plurality of first wiring layers stacked in an alternating manner on top surfaces of the first and second metal cores, a lower portion including a plurality of second insulating layers and a plurality of second wiring layers stacked in an alternating manner on bottom surfaces of the first and second metal cores, and at least one capacitor disposed in at least one interior region between the first and second metal cores. The at least one interior region exposes a first side surface of the first metal core and a second side surface of the second metal core which is disposed opposite to and spaced apart from the first side surface of the first metal core and exposes a portion of at least one of the first and second portions adjacent to the first and second metal cores. The at least one capacitor includes a plurality of ceramic dielectric layers, a plurality of internal electrodes, a first electrode and a second electrode. The first and second electrodes are thicker than the first and second metal cores. In addition, the ceramic dielectric layers and the internal electrodes are disposed between the first and second electrodes as an alternatingly stacked structure.

The wiring board further includes at least one first via configured to connect one of the first wiring layers electrically to the first and second electrodes and at least one second via configured to connect one of the second wiring layers electrically to the first and second electrodes. A first surface of the first and second electrodes is connected to the at least one first via and a second surface of the first and second electrodes is connected to the at least one second via.

BRIEF DESCRIPTION OF THE DRAWINGS

Example embodiments can be more clearly understood from the following brief description taken in conjunction with the accompanying drawings. The accompanying drawings represent non-limiting, example embodiments as described herein.

FIGS. 2 and 3 are sectional views illustrating wiring boards according to an example embodiment of the inventive concept;

FIG. 5B is a plan view taken along a line II-II' of FIG. 5A;

DETAILED DESCRIPTION OF EXAMPLE EMBODIMENTS

Figure 1A:
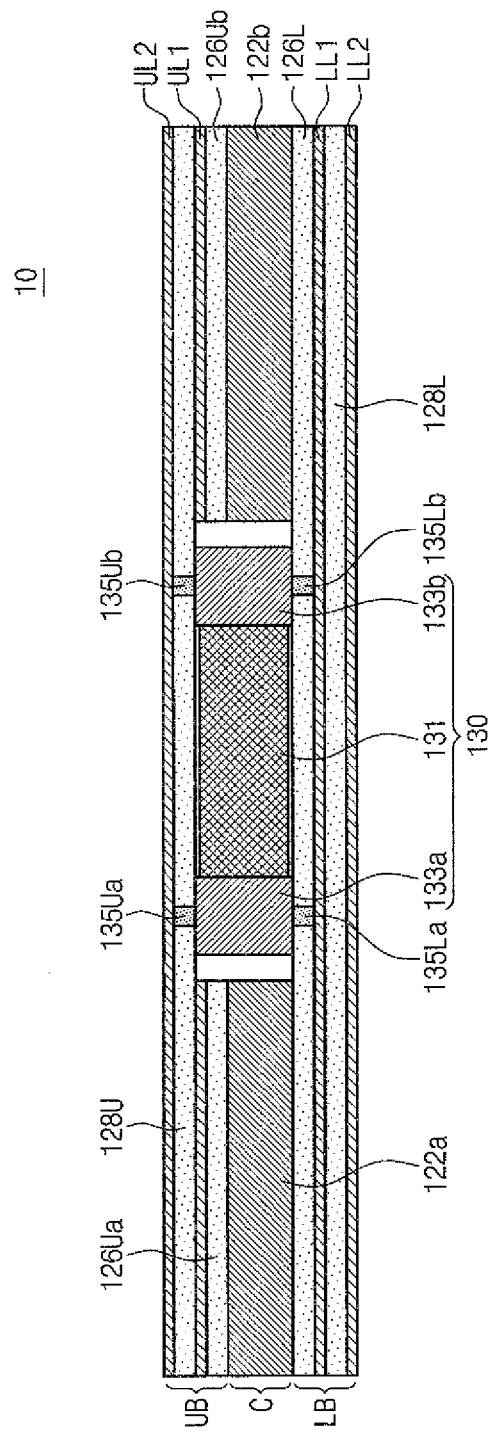
FIG. 1A is a sectional view illustrating a wiring board according to an example embodiment of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to example embodiments set forth herein. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Figure 1B:
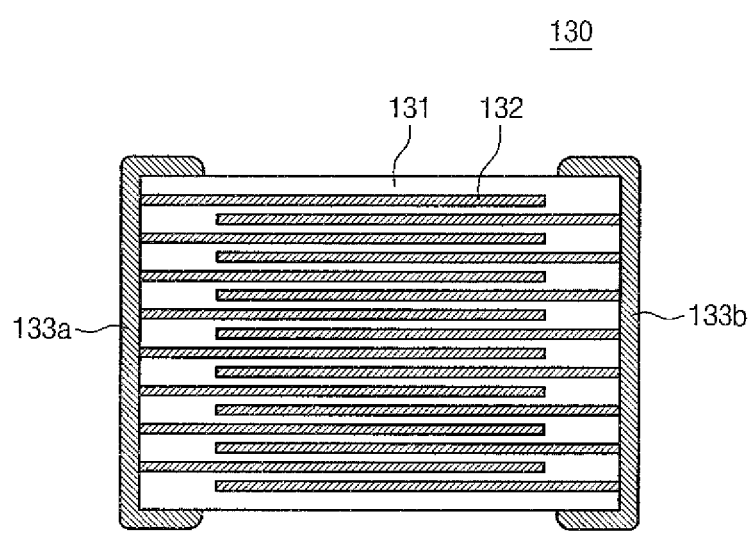
FIG. 1B is a sectional view exemplarily illustrating a configuration of the wiring board of FIG. 1A.

FIG. 1A is a sectional view illustrating a wiring board according to an example embodiment of the inventive concept, and FIG. 1B is a sectional view exemplarily illustrating a configuration of the wiring board of FIG. 1A.

Referring to FIGS. 1A and 1B, a wiring board 10 may include, for example, a core portion C, a capacitor 130 provided therein, an upper portion UB disposed on a top surface of the core portion C, and a lower portion LB disposed on a bottom surface of the core portion C.

The core portion C may have a structure extending along a specific direction. The core portion C may include, for example, a first metal core 122a and a second metal core 122b. The lower and upper portions LB and UB may cover bottom and top surfaces, respectively, of the first and second metal cores 122a and 122b. The lower portion LB may include, for example, insulating layers 126L and 128L and wiring layers LL1 and LL2, which may be provided on the bottom surfaces of the first and second metal cores 122a and 122b. The upper portion UB may include, for example, insulating layers 126Ua, 126Ub, and 128U and wiring layer UL1 and UL2, which may be provided on the top surfaces of the first and second metal cores 122a and 122b. At least one of the insulating layers 126L, 126Ua, 126Ub, 128L, and 128U may include, for example, one of prepreg materials. At least one of the wiring layers LL1, LL2, UL1, and UL2 may include, for example, at least one conductive circuit pattern and at least one insulating pattern electrically separating them from each other. Example embodiments of the inventive concept may not be limited to the present example embodiment in which the wiring board 10 has, for example, two metal cores 122a and 122b. Alternatively, for example, in an embodiment of the inventive concept, the wiring board 10 may include, for example, three or more metal cores spaced apart horizontally from each other or one metal core.

In an example embodiment, the first metal core 122a may be disposed at, for example, a central region of the wiring board 10 in a direction perpendicular to a top surface of the core portion. The first metal core 122a may include, for example, one selected the group consisting of a stainless steel, aluminum (Al), nickel (Ni), magnesium (Mg), zinc (Zn), tantalum (Ta), or any combination thereof.

The second metal core 122b may be disposed, for example, in a central region of the wiring board 10 in a direction perpendicular to the top surface of the core portion. The second metal core 122b may include, for example, a side surface, which may be opposite to and spaced apart from a side surface of the first metal core 122*a*. The second metal core 122*b* may include, for example, substantially the same material as that of the first metal core 122*a*. For example, the second metal core 122*b* may include one selected the group consisting of a stainless steel, aluminum, nickel, magnesium, zinc, tantalum, or any combination thereof.

The capacitor 130 may be provided, for example, in an interior region between the first and second metal cores 122*a* and 122*b*. The interior region may be a region formed by, for example, removing a portion of the metal core of the core portion C as well as a portion of at least one of the lower and upper portions LB and UB adjacent thereto. In an example embodiment, the interior region may be formed by, for example, removing partially the first and second metal cores 122*a* and 122*b* and partially the upper portion UB (for example, the insulating layers 126Ua and 126Ub and the wiring layer UL1). The capacitor 130 may include, for example, a first electrode 133*a* and a second electrode 133*b*, which are thicker than the first and second metal cores 122*a* and 122*b*, and a dielectric layer 131 interposed between the first and second electrodes 133*a* and 133*b*.

In an example embodiment, the capacitor 130 may be configured to have, for example, a multi-layered ceramic capacitor structure. For example, as shown in FIG. 1B, the capacitor 130 may include a plurality of the ceramic dielectric layers 131, internal electrodes 132, and the first and second electrodes 133*a* and 133*b*. The ceramic dielectric layers 131 and the internal electrodes 132 may be arranged in the capacitor 130 to have, for example, an alternatingly stacked structure. For example, odd-numbered ones of the internal electrodes 132 may be electrically connected to the first electrode 133*a*, and even-numbered ones of the internal electrodes 132 may be electrically connected to the second electrode 133*b*. The first and second electrodes 133*a* and 133*b* may include, for example, silver (Ag) or copper (Cu). Each of the internal electrodes 132 may include, for example, one selected the group consisting of silver (Ag), palladium (Pd), platinum (Pt), silver-palladium alloys, nickel, copper, or any combination thereof. The ceramic dielectric layers 131 may include a ceramic material including, for example, barium titanate ($BaTiO_3$) as a main ingredient thereof.

First vias 135Ua and 135Ub may be provided and each of them may be configured to connect, for example, the wiring layer UL2 electrically to the first and second electrodes 133*a* and 133*b*, respectively. In an example embodiment, each of the first vias 135Ua and 135Ub may be respectively connected to, for example, a surface of the first and second electrodes 133*a* and 133*b* parallel to top and bottom surfaces of the first and second metal cores 122*a* and 122*b*. The first vias 135Ua and 135Ub may, for example, penetrate the insulating layer 128U of the upper portion UB to connect the wiring layer UL2 electrically to a selected one of surfaces of the first and second electrodes 133*a* and 133*b*, respectively. Alternatively, in an example embodiment, the first vias 135Ua and 135Ub may be configured to connect, for example, the wiring layer UL1 electrically to the first and second electrodes 133*a* and 133*b*, respectively.

Furthermore, as shown, second vias 135La and 135Lb may be provided and each of them may be configured to, for example, connect the wiring layer LL1 electrically to the first and second electrodes 133*a* and 133*b*, respectively. In an example embodiment, each of the second vias 135La and 135Lb may be respectively connected to, for example, a surface of the first and second electrodes 133*a* and 133*b*, which may be parallel to top and bottom surfaces of the first and second metal cores 122*a* and 122*b*. The first and second metal cores 122*a* and 122*b* are not connected with the first and second electrodes 133*a* and 133*b*.

Alternatively, in an example embodiment, the second vias 135La and 135Lb may be configured to connect, for example, the wiring layer LL2 electrically to the first and second electrodes 133*a* and 133*b*, respectively.

In an example embodiment, the conductive circuit patterns of the wiring layers connected to the first and second vias 135Ua, 135Ub, 135La, and 135Lb may be electrically separated from each other.

The first electrode 133*a* may be applied with a first potential, and the second electrode 133*b* may be applied with a second potential. In an example embodiment, as the first vias 135Ua and 135Ub connect the wiring layer UL2 to the first and second electrodes 133*a* and 133*b*, respectively, and the wiring layer UL2 includes conductive circuit patterns, the first potential may be applied from the wiring layer UL2 to the first electrode 133*a* through the first via 135Ua, and the second potential different from the first potential may be applied from the wiring layer UL2 to the second electrode 133*b* through the first via 135Ub. In other words, the first via 135Ua coupled to the first electrode 133*a* may be electrically connected to a conductive circuit pattern in the wiring layer UL2, and the first via 135Ub coupled to the second electrode 133*b* may be electrically connected to other conductive circuit pattern in the wiring layer UL2. For example, the first potential may be a ground voltage, and the second potential may be a power voltage applied to the wiring board 10. In addition, similar to the first vias 135Ua and 135Ub, the second vias 135La and 135Lb may be configured to apply different voltages to the first and second electrodes 133*a* and 133*b*, respectively.

According to the embodiment described with reference to FIG. 1A, the interior region provided with the capacitor 130 may be a region formed by, for example, removing a portion of the metal core of the core portion C and a portion of the upper portion UB adjacent thereto. Alternatively, in an example embodiment, the interior region provided with the capacitor 130 may include a region formed by removing a portion of the lower portion LB, instead of the portion of the upper portion UB or include a region formed by removing portions of the lower and upper lower portions LB and UB.

Although not shown in detail, at least one of the wiring layers LL1, LL2, UL1, and UL2 may, for example, be electrically connected to the first and second metal cores 122*a* and 122*b* via the conductive circuit pattern(s) provided in the wiring layers LL1, LL2, UL1, and UL2. In addition, for example, the wiring layers LL1 and LL2 of the lower portion LB may be electrically connected to each other and be spatially spaced apart from each other by the insulating layer 128L, and the wiring layers UL1 and UL2 of the upper portion UB may be electrically connected to each other and be spatially spaced apart from each other by the insulating layer 128U.

Hereinafter, wiring boards according to an example embodiment of the inventive concept will be described in more detail with reference to FIGS. 2 through 5B. FIGS. 2, 3, 4A, and 5A are sectional views illustrating wiring boards according to an example embodiment of the inventive concept, and FIGS. 4A and 5A are plan views illustrating wiring boards according to an example embodiment of the inventive concept. For the sake of brevity, an interior region provided with a capacitor will be mainly explained in a description on the wiring board depicted in FIGS. 2 through 5B. For concise description, a previously described element may be identified by a similar or identical reference number without repeating an overlapping description thereof.

Figure 3:
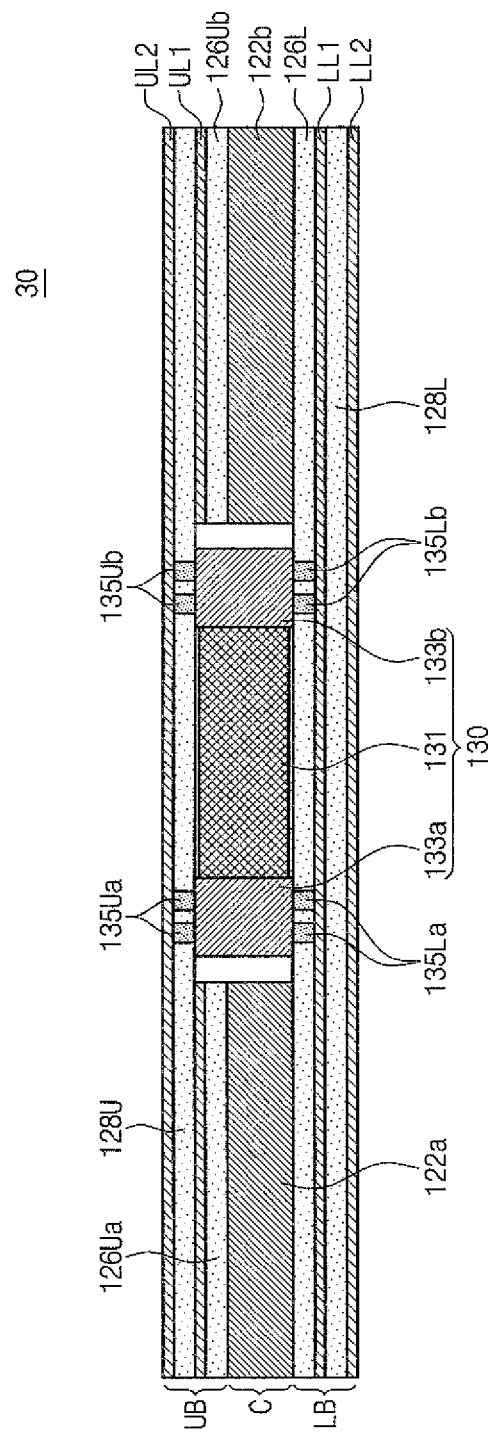
Figure 4A:
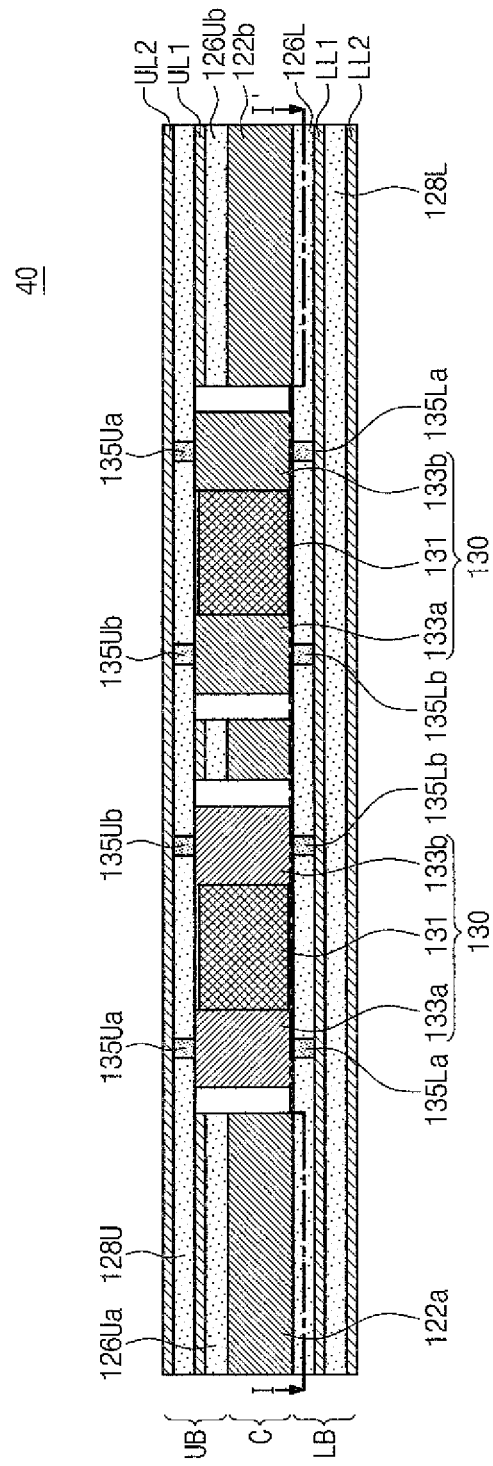
FIG. 4A is a sectional view illustrating a wiring board according to an example embodiment of the inventive concept.

FIGS. 2 and 3 are sectional views illustrating wiring boards according to an example embodiment of the inventive concept.

Referring to FIG. 2, a wiring board 20 according to this embodiment may be configured to have an interior region structure different from the wiring board 10 described above. For example, the interior region provided with the capacitor 130, in this embodiment, may be a region formed by, for example, removing a portion of the metal core of the core portion C and a portion of the lower portion LB adjacent thereto. In an example embodiment, the interior region provided with the capacitor 130 may further include, for example, a region formed by removing a portion of the upper portion UB.

Referring to FIG. 3, a wiring board 30 according to this embodiment may differ from the wiring board 10 described above, in that two or more first vias 135Ua and 135Ub may be used to connect at least one of the first and second electrodes 133a and 133b to the wiring layer UL2. This allows for the suppression of technical difficulties (e.g., deterioration in characteristics of the capacitor 130), which may occur when the wiring layer UL2 may be connected to the first and second electrodes 133a and 133b via one first via 135Ua or 135Ub. In addition, two or more second vias 135La and 135Lb may be used to connect at least one of the first and second electrodes 133a and 133b to the wiring layer LL1.

Figure 4B:
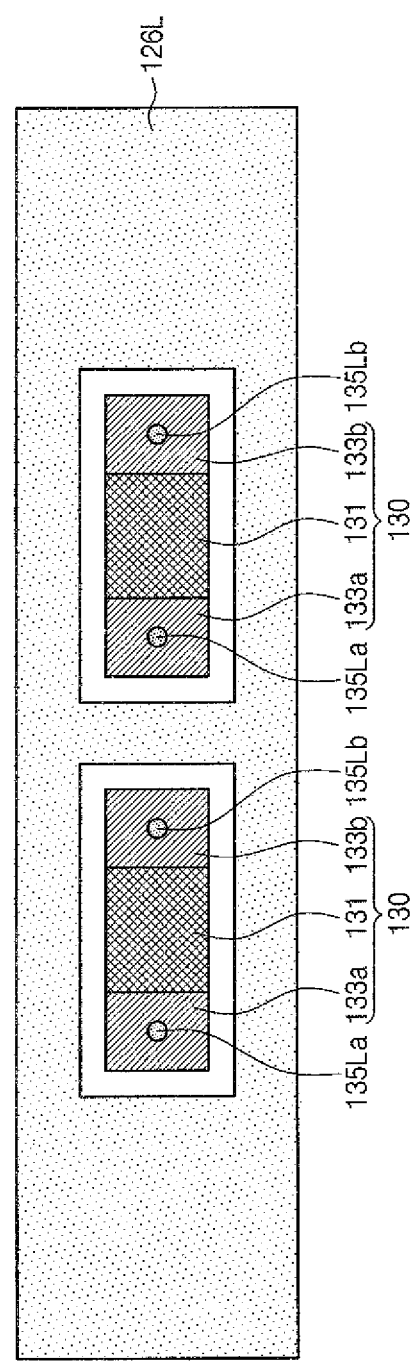
FIG. 4B is a plan view taken along a line I-I' of FIG. 4A.
Figure 5A:
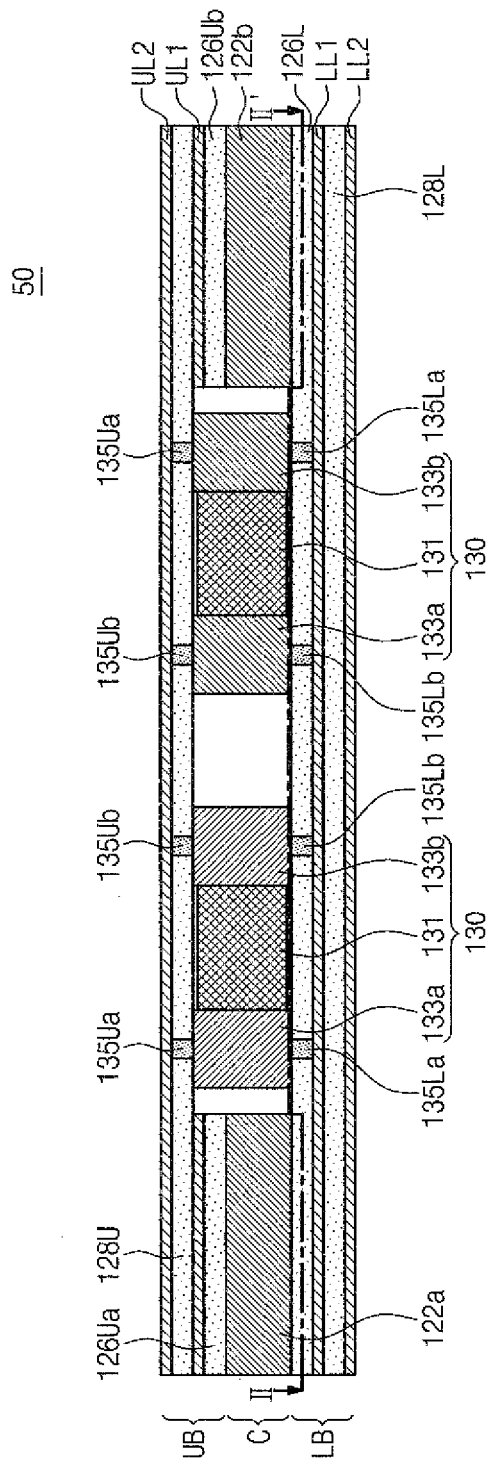
FIG. 5A is a sectional view illustrating a wiring board according to an example embodiment of the inventive concept.

FIG. 4A is a sectional view illustrating a wiring board according to an example embodiment of the inventive concept, and FIG. 4B is a plan view taken along a line I-I' of FIG. 4A.

Referring to FIGS. 4A and 4B, a wiring board 40 according to this embodiment may differ from the wiring board 10 described above, in that a plurality of interior regions may be provided in the wiring board 40. In an example embodiment, each of the interior regions may include at least one capacitor, which may be configured to have the same structure as the capacitor 130 in the wiring board 10.

FIG. 5A is a sectional view illustrating a wiring board according to an example embodiment of the inventive concept, and FIG. 5B is a plan view taken along a line II-II' of FIG. 5A.

Referring to FIGS. 5A and 5B, a wiring board 50 according to this embodiment may differ from the wiring board 10 described above, in that the interior region may be configured to include a plurality of capacitors 130. In an example embodiment, the capacitors 130 may be arranged to have, for example, a regular shape or a regular configuration.

Figure 6:
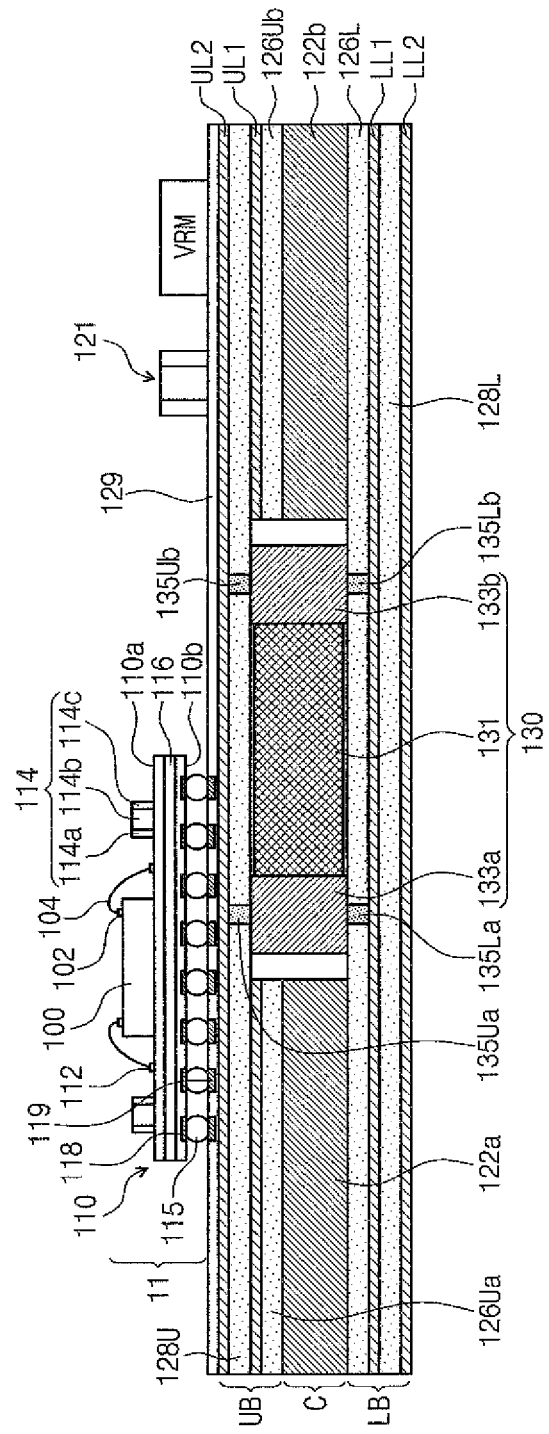
FIG. 6 is a sectional view illustrating a semiconductor module according to an example embodiment of the inventive concept.

FIG. 6 is a sectional view illustrating a semiconductor module according to an example embodiment of the inventive concept. For concise description, a previously described element may be identified by a similar or identical reference number without repeating an overlapping description thereof.

Referring to FIG. 6, a semiconductor module may include, for example, a semiconductor package 11 and a wiring board. In an example embodiment, the wiring board in the semiconductor module may be configured to have the same feature as the wiring board 10 described with reference to FIG. 1A. Alternatively, in an example embodiment, one of the wiring boards 20, 30, 40, and 50 described with reference to FIGS. 2, 3, 4A, and 5A may be used instead for the wiring board in the semiconductor module. The semiconductor package 11 may be mounted on the wiring board 10. The semiconductor package 11 may be electrically connected to the wiring board 10 via, for example, at least one connecting pattern 115. The wiring board 10 may include, for example, a first capacitor, which may be configured to have the same feature as the capacitor 130 described above. The first capacitor may, for example, be mounted in the wiring board 10 (for example, to have an embedding structure).

The semiconductor package 11 may include, for example, a package substrate 110 and a semiconductor chip 100 mounted on the package substrate 110.

The semiconductor chip 100 may be disposed on, for example, one surface 110a of the package substrate 110. In an example embodiment, the semiconductor chip 100 may, for example, be provided near a central portion of the package substrate 110. In an embodiment, the semiconductor chip 100 may, for example, be provided near an edge portion of the package substrate 110.

For example, a plurality of circuit patterns 116 may be provided in the package substrate 110. The circuit patterns 116 may be configured in such a way that predetermined voltages may be applied thereto.

A first bonding pad 112 may be provided, for example, adjacent to the semiconductor chip 100 on the surface 110a of the package substrate 110. Furthermore, for example, a second bonding pad 102 may be provided on a surface of the semiconductor chip 100. A bonding wire 104 may be provided, for example, to connect the first bonding pad 112 electrically with the second bonding pad 102, such that the package substrate 110 may be electrically connected to the semiconductor chip 100.

A second capacitor 114 may be provided, for example, on the surface 110a of the package substrate 110. In an example embodiment, the second capacitor 114 may be mounted on the package substrate 110 using, for example, a surface mount technology (SMT). The second capacitor 114 may include, for example, two electrodes 114a and 114c and a dielectric layer 114b interposed therebetween. The electrodes 114a and 114c may, for example, be electrically connected to the circuit patterns 116. For example, one of the electrodes 114a and 114c may be electrically connected to one of the circuit patterns 116 applied with a ground voltage, and the other of the electrodes 114a and 114c may be electrically connected to one of the circuit patterns 116 applied with the power voltage of the package substrate 110. The power voltage may be a voltage supplied from, for example, an external device to operate the semiconductor package 11.

For example, at least one third bonding pad 118 may be provided on other surface 110b of the package substrate 110. The third bonding pad 118 may, for example, be electrically connected to the connecting pattern 115.

The connecting pattern 115 may be configured to connect the package substrate 110 electrically with the wiring board 10. In an example embodiment, the connecting pattern 115 may be provided in the form of, for example, a solder bump, and this allows for a reduction in the size of the semiconductor package 11.

In an example embodiment, the semiconductor chip 100 may, for example, be directly mounted on the wiring board 10 using the connecting pattern 115.

The wiring board 10 may further include, for example, a connecting layer 129 provided on the upper portion UB. The connecting layer 129 may include, for example, at least one fourth bonding pad 119. The at least one fourth bonding pad 119 may, for example, be electrically connected to the connecting pattern 115, such that the wiring board 10 may be electrically connected to the package substrate 110.

Although not shown, the wiring board 10 may include, for example, an additional connecting layer (not shown) provided on the lower portion LB. The additional connecting layer may include, for example, a fifth bonding pad (not shown), and the fifth bonding pad may be electrically connected to the corresponding one of input/output terminals (not shown), thereby providing an electrical pathway from or to an external device.

Although not shown in detail, at least one of the wiring layers LL1, LL2, UL1, and UL2 may be, for example, electrically connected to the first and second metal cores 122a and 122b via the conductive circuit pattern(s) provided in the wiring layers LL1, LL2, UL1, and UL2. In addition, the wiring layers LL1 and LL2 of the lower portion LB may, for example, be electrically connected to each other and be spatially spaced apart from each other by the insulating layer 128L, and the wiring layers UL1 and UL2 of the upper portion UB may, for example, be electrically connected to each other and be spatially spaced apart from each other by the insulating layer 128U.

For example, in an example embodiment, each of the wiring layers LL1, LL2, UL1, and UL2 may include at least one conductive circuit pattern, and thus, the wiring layers UL1 and UL2 of the upper portion UB may be electrically connected to the package substrate 110 and the first and second metal cores 122a and 122b. In addition, the wiring layers LL1 and LL2 of the lower portion LB may be electrically connected to the first and second metal cores 122a and 122b and an external terminal (not shown).

The semiconductor module 10 may further include, for example, a voltage regulation module VRM and a third capacitor 121.

The voltage regulation module VRM may be provided on, for example, a surface of the wiring board 10. The voltage regulation module VRM may, for example, be configured to control a voltage supplied to the wiring board 10. For example, the voltage regulation module VRM may be configured to receive an input voltage within a predetermined voltage range and block other excessive voltage beyond the predetermined voltage range. In an example embodiment, to do this, the voltage regulation module VRM may include, for example, at least one filter device passively or actively controlling a voltage applied thereto.

The third capacitor 121 may be disposed, for example, adjacent to the voltage regulation module VRM. For example, the third capacitor 121 may be a bulk capacitor.

The wiring board according to an example embodiment of the inventive concept may include at least one capacitor provided in the interior region, which may be formed by removing a portion of the metal core as well as a portion of insulating and wiring layers of the upper or lower portion, and therefore, the capacitor provided in the interior region can have sufficiently high capacitance, even if it becomes thin. This allows for the providing of a wiring board, which can be miniaturized while maintaining sufficiently high capacitance.

In addition, the wiring board according to an example embodiment of the inventive concept may include an embedded capacitor, which may be configured to have a multi-layered ceramic capacitor, and this allows for an increase in the capacitance of the embedded capacitor. Accordingly, it is possible to provide a wiring board, which can be miniaturized while maintaining sufficiently high capacitance.

Furthermore, a semiconductor module according to an example embodiment of the inventive concept may include at least one capacitor provided in the interior region, which may be formed by removing a portion of the metal core of the wiring board as well as a portion of insulating and wiring layers of the upper or lower portion, and therefore, the capacitor provided in the interior region can have sufficiently high capacitance, even if the wiring board becomes thin. Accordingly, it is possible to provide a semiconductor module including a wiring board, which can be miniaturized while maintaining sufficiently high capacitance.

Figure 7:
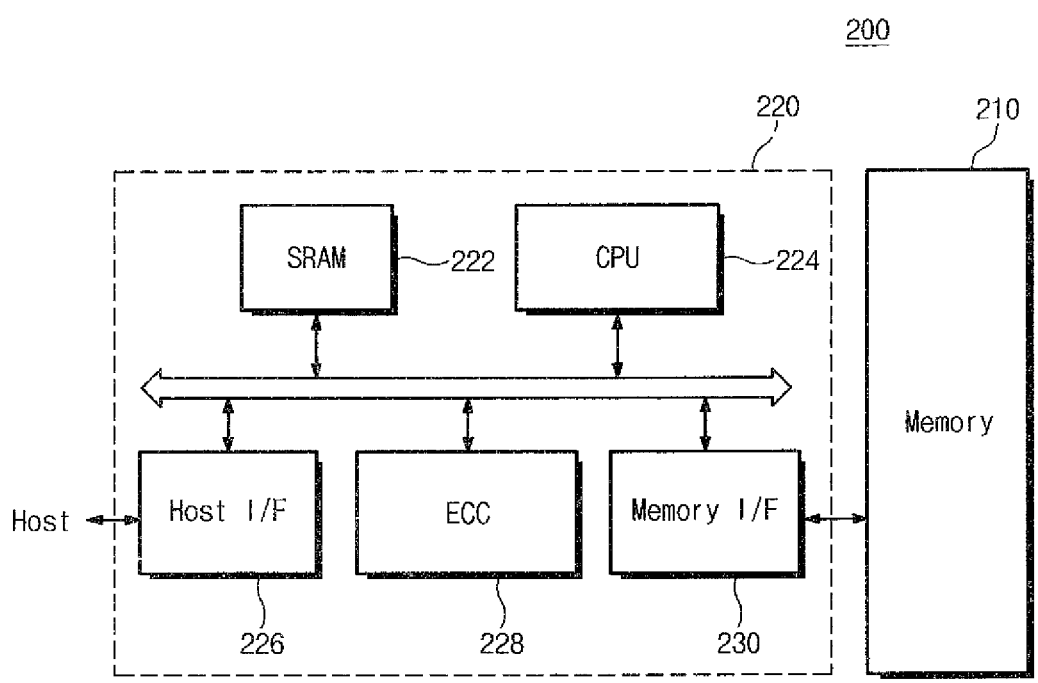
FIG. 7 is a block diagram illustrating a memory card including a semiconductor module according to an example embodiment of the inventive concept.

FIG. 7 is a block diagram illustrating a memory card including a semiconductor module according to an example embodiment of the inventive concept.

Referring to FIG. 7, a semiconductor module according to an example embodiment of the inventive concept may be used to realize, for example, a memory card 200. For example, the memory card 200 may include a memory controller 220 controlling general data exchanges between a host and a memory device 210. A static random access memory (SRAM) 222 may be used as an operating memory of a central processing unit (CPU) 224. A host interface (host I/F) 226 may include, for example, a data exchange protocol of a host connected to the memory card 200. An error correction code (ECC) 228 may detect and correct errors included in data read from the memory device 210. A memory interface (memory I/F) 230 may interface with the memory device 210. The central processing unit 224 may perform general control operations for data exchange of the memory controller 220.

As the memory card 200 may include the memory device 210 provided with a semiconductor module according to an example embodiment of the inventive concept, it is possible to realize a semiconductor module with increased integration density. In addition, it is possible to reduce technical difficulties, which may occur in a process of mounting a capacitor in a wiring board.

Figure 8:
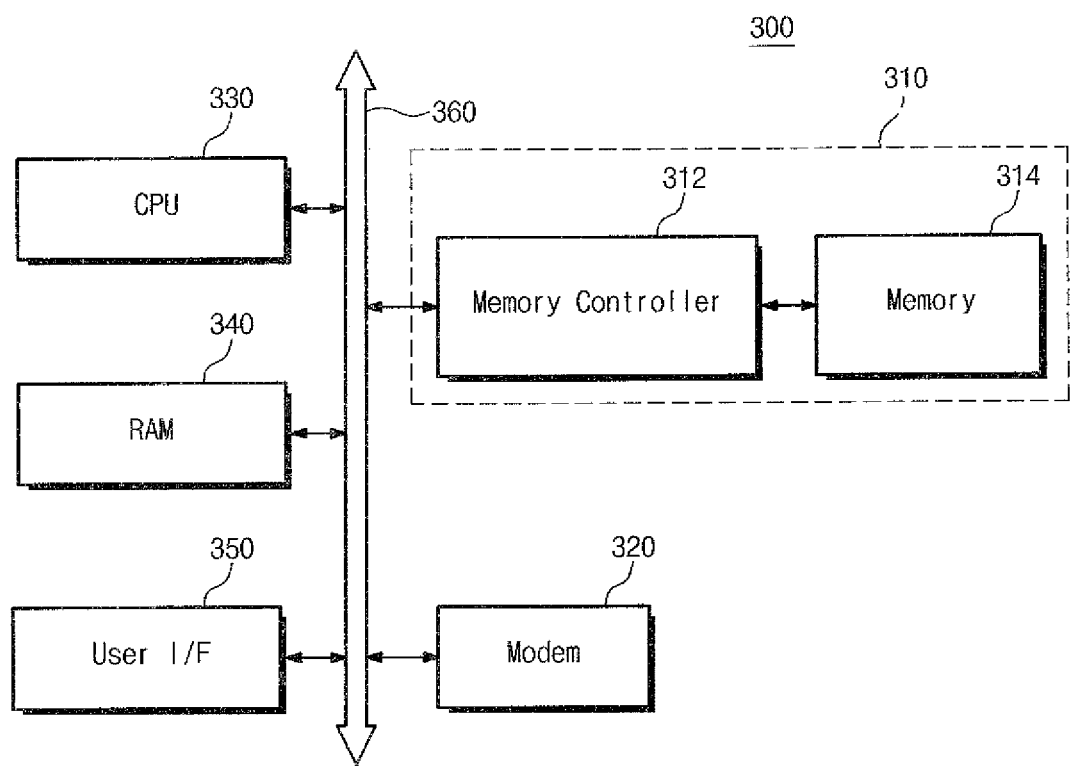
FIG. 8 is a block diagram illustrating an information processing system including a semiconductor module according to an example embodiment of the inventive concept.

FIG. 8 is a block diagram illustrating an information processing system including a semiconductor module according to an example embodiment of the inventive concept.

Referring to FIG. 8, an information processing system 300 may be realized using, for example, a memory system 310 including a semiconductor module according to an example embodiment of the inventive concept. For example, the information processing system 300 may be a mobile device and/or a desktop computer. In an example embodiment, the information processing system 300 may further include, for example, a modem 320, a central processing unit (CPU) 330, a RAM 340, and a user interface (user I/F) 350, which are electrically connected to a system bus 360, in addition to the memory system 310. Data processed by the CPU 330 and/or input from the outside may be stored in the memory system 310. The memory system 310 may include, for example, a memory device 314 and a memory controller 312, and in an example embodiments, the memory system 310 may be configured substantially identical to the memory card 200 previously described with respect to FIG. 7. Although not illustrated, it is apparent to those skilled in the art that, for example, a memory card, a solid state drive (SSD), an application chipset, a camera image sensor, a camera image signal processor (ISP), an input/output device, or the like may further be included in the information processing system 300 according to an example embodiment of the inventive concept. In an example embodiment, the memory system 310 may be, for example, used as a portion of the solid state drive (SSD), and in this case, the information processing system 300 may stably and reliably store a large amount of data in the memory system 310.

According to an example embodiment of the inventive concept, at least one capacitor may be provided in the interior region, which may be formed by removing a portion of the metal core of the wiring board as well as a portion of insulating and wiring layers of the upper or lower portion, and thus, it is possible to achieve a sufficiently high capacitance, even if the wiring board becomes thin. Accordingly, it is possible to provide a wiring board, which can be miniaturized while maintaining sufficiently high capacitance.

In addition, according to an example embodiment of the inventive concept, a wiring board may include an embedded capacitor configured to have a multi-layered ceramic capacitor structure, and this allows for an increase in the capacitance of the embedded capacitor. Accordingly, it is possible to provide a wiring board, which can be miniaturized while maintaining sufficiently high capacitance.

Furthermore, according to an example embodiment of the inventive concept, at least one capacitor may be provided in the interior region, which may be formed by removing a portion of the metal core of the wiring board as well as a portion of insulating and wiring layers of the upper or lower portion, and thus, it is possible to achieve a sufficiently high capacitance, even if the wiring board becomes thin. Accordingly, it is possible to provide a semiconductor module including a wiring board, which can be miniaturized while maintaining sufficiently high capacitance.

Having described example embodiments of the inventive concept, it is readily apparent to those of ordinary skill in the art that various modifications may be made without departing from the sprit and scope of the invention which is defined by the metes and bounds of the appended claims.

What is claimed is:

1. A wiring board, comprising:
a core including a first surface and a second surface facing each other;
a first portion and a second portion disposed on the first and second surfaces, respectively, wherein each of the first and second portions comprises a plurality of insulating layers and a plurality of wiring layers stacked in an alternating manner;
at least one capacitor disposed in at least one interior region, wherein the at least one capacitor comprises a first electrode thicker than the core and a second electrode thicker than the core, and wherein the at least one interior region exposes a portion of the core and a portion of the first portion adjacent to the core; and
at least one first via electrically connecting one of the wiring layers of the first portion with the first and second electrodes,
wherein a surface of the first and second electrodes is in contact with the at least one first via,
wherein thicknesses of the first and second electrodes are larger than a sum of a thickness of the core and a thickness of an insulating layer which is included in the first portion and which is closest to the core, and
wherein an insulating layer which is included in the second portion and which is closest to the core covers the second surface of the core and bottom surfaces of the first and second electrodes.

2. A semiconductor module, comprising:
a wiring board comprising a core with a first surface and a second surface facing each other, a first portion and a second portion disposed on the first and second surfaces, respectively, at least one first capacitor disposed in at least one interior region, and at least one first via;
a semiconductor chip mounted on the wiring board; and
a connecting pattern connecting the semiconductor chip electrically with the wiring board,
wherein each of the first and second portions comprises a plurality of insulating layers and a plurality of wiring layers stacked in an alternating manner,
wherein the at least one first capacitor comprises a first electrode thicker than the core and a second electrode thicker than the core,
wherein the at least one interior region exposes a portion of the core and a portion of the first portion adjacent to the core,
wherein the at least one first via connects one of the wiring layers of the first portion electrically with the first and second electrodes, and
wherein a surface of the first and second electrodes is in contact with the at least one first via,
wherein thicknesses of the first and second electrodes are larger than a sum of a thickness of the core and a thickness of an insulating layer which is included in the first portion and which is closest to the core, and
wherein an insulating layer which is included in the second portion and which is closest to the core covers the second surface of the core and bottom surfaces of the first and second electrodes.

3. A board comprising:
a first wiring layer;
a first insulating layer disposed on the first wiring layer;
a core disposed on the first insulating layer;
a second insulating layer disposed on the core;
a second wiring layer disposed on the second insulating layer;
a third insulating layer disposed on the second wiring layer;
a third wiring layer disposed on the third insulating layer;
a capacitor disposed in an interior space of the board and including a first electrode and a second electrode;
a first via configured to electrically connect the first electrode to the third wiring layer; and
a second via configured to electrically connect the second electrode to the third wiring layer,
wherein the first electrode is configured to be applied with a first potential,
the second electrode is configured to be applied with a second potential, the second potential being different from the first potential, and
a thickness of the first electrode is greater than a sum of a thickness of the core and a thickness of the second insulating layer.

4. The board of claim 3, wherein the first insulating layer at least partially covers a bottom surface of the core, a bottom surface of the first electrode and a bottom surface of the second electrode.

5. The board of claim 3, wherein at least a portion the interior space is disposed in the core and the second insulating layer.

6. The board of claim 3, wherein a thickness of the second electrode is greater than the sum of the thickness of the core and the thickness of the second insulating layer.

7. The board of claim 3, further comprising:
a third via configured to electrically connect the first electrode to the first wiring layer; and
a fourth via configured to electrically connect the second electrode to the first wiring layer.

8. The board of claim 3, wherein the first potential is a power supply voltage, and the second potential is a ground.

9. A board comprising:
a first wiring layer;
a first insulating layer disposed on the first wiring layer;
a first layer disposed on the first insulating layer;
a second insulating layer disposed on the first layer;
a second wiring layer disposed on the second insulating layer;
a first capacitor disposed in an interior space of the board and including a first electrode and a second electrode;
a first via disposed between the first electrode and the first wiring layer, the first via being configured to electrically connect the first electrode to the first wiring layer;
a second via disposed between the first electrode and the first wiring layer, the second via being configured to electrically connect the first electrode to the first wiring layer;
a third via disposed between the second electrode and the first wiring layer, the third via being configured to electrically connect the second electrode to the first wiring layer; and
a fourth via disposed between the second electrode and the first wiring layer, the fourth via being configured to electrically connect the second electrode to the first wiring layer,
wherein the first electrode is configured to be applied with a first potential through the first via and the second via, and the second electrode is configured to be applied with a second potential through the third via and the fourth via, the second potential being different from the first potential.

10. The board of claim 9, wherein the first potential is a ground, and the second potential is a power supply voltage.

11. The board of claim 9, wherein the first insulating layer at least partially covers a bottom surface of the first layer, a bottom surface of the first electrode and a bottom surface of the second electrode.

12. The board of claim 9, wherein the first electrode is thicker than the first layer.

13. The board of claim 9, wherein a thickness of the first electrode is greater than a sum of a thickness of the first layer and a thickness of the second insulating layer.

14. The board of claim 9, wherein the first layer is a metal core.

15. The board of claim 9, further comprising:
a fifth via configured to be electrically connected to the first electrode;
a sixth via configured to be electrically connected to the first electrode;
a seventh via configured to be electrically connected to the second electrode; and
an eighth via configured to be electrically connected to the second electrode.

16. The board of claim 9, wherein at least a portion the interior space is disposed in the first layer and the second insulating layer.

17. A semiconductor device comprising:
a board; and
a semiconductor package disposed on the board and electrically connected to the board, the semiconductor package including a substrate and a semiconductor chip disposed on the substrate,
wherein the board includes:
a first wiring layer;
a first insulating layer disposed on the first wiring layer;
a first layer disposed on the first insulating layer;
a second insulating layer disposed on the first layer;
a second wiring layer disposed on the second insulating layer;
a first capacitor disposed in an interior space of the board and including a first electrode and a second electrode;
a first via disposed between the first electrode and the first wiring layer, the first via being configured to electrically connect the first electrode to the first wiring layer;
a second via disposed between the first electrode and the first wiring layer, the second via being configured to electrically connect the first electrode to the first wiring layer;
a third via disposed between the second electrode and the first wiring layer, the third via being configured to electrically connect the second electrode to the first wiring layer; and
a fourth via disposed between the second electrode and the first wiring layer, the fourth via being configured to electrically connect the second electrode to the first wiring layer,
wherein the first electrode is configured to be applied with a first potential a second potential through the third via and the fourth via, the second potential being different from the first potential.

18. The semiconductor device of claim 17, wherein the board further includes a second capacitor disposed in the interior space of the board, and
the second capacitor includes a third electrode and a fourth electrode.

19. The semiconductor device of claim 17, wherein the semiconductor package includes a third capacitor disposed on the substrate of the semiconductor package.

20. The semiconductor device of claim 17, further comprising:
a passive device disposed on the board; and
a voltage regulation module disposed on the board.

* * * * *